Feb. 6, 1968

G. F. CARAISCO ET AL 3,367,223

SEMICONDUCTOR LEAD CUTTER

Filed Jan. 7, 1966

INVENTORS.
GEORGE F. CARAISCO
VICTOR P. ELISCHER

Roland A. Anderson
ATTORNEY.

United States Patent Office 3,367,223

Patented Feb. 6, 1968

3,367,223

SEMICONDUCTOR LEAD CUTTER

George F. Caraisco and Victor P. Elischer, El Cerrito, Calif., assignors to the United States of America as represented by the United States Atomic Energy Commission Filed Jan. 7, 1966, Ser. No. 519,393
5 Claims. (Cl. 83—389)

ABSTRACT OF THE DISCLOSURE

This invention is a hand tool for trimming semiconductor lead wires to uniform length without vibrational damage to the wafer-lead junctions. The device includes a base having a notched edge for receiving a predetermined length of the leads, a cutting arm pivoted to cut against the edge, and a complementary-notched damping block spring-mounted on the arm to seat against the leads during cutting.

This invention relates to tools for facilitating the fabrication of electronic circuits having semiconductor components, and in particular to a device for cutting the terminal leads of transistors and the like to a uniform length and without damage thereto. The invention was developed during the course of, or under contract W-7405-eng-48 with the United States Atomic Energy Commission.

The invention fulfills the need for a mobile, compact apparatus for cutting the lead wires of a transistor or other semiconductor circuit element during the fabrication of electronic devices. It has been found that cutting the excess length of terminal lead wires on a transistor with ordinary shears establishes a high frequency vibration in the lead. This vibration travels up the lead wire to the point contact on the transistor and can cause damage to the barrier junction. The vibrational damage to the junction may decrease the useful lifetime of the transistor by fifty percent or more.

The device essentially comprises a base section in which the transistor is positioned with the transistor leads lying in a specially grooved mount provided therefor. A cutting arm is pivoted at one end to the base such that a knife-edge on the arm slides past an opposing edge on the mount, cutting transverse to the grooves. A damping block, formed to fit within the grooves, is spring-mounted on the cutting arm with the formed edge extending slightly beyond the knife-edge of the arm to hold the terminal leads prior to being cut, thus preventing the damaging vibrations.

The tool has several advantages; it prevents the high frequency vibration which commonly occurs with ordinary lead-cutter shears; it cuts several leads at once as opposed to the ordinary shears; and it consistently cuts leads to a uniform length. The uniform lead length is desirable when the transistors are to be mounted in sockets or other mounting hardware. The tool is small and portable, and can be operated very rapidly.

Accordingly, a primary object of this invention is to provide a specialized cutting tool for the terminal leads of semiconductor circuit elements which prevents damage to the terminal junction during the cutting operation.

Another object of the invention is to provide a hand cutting tool which trims the leads of a transistor or the like to uniform length.

A further object of the invention is to provide a means for rapidly and accurately trimming the terminal leads of a large number of semiconductor circuit elements.

The apparatus will be better understood with reference to the accompanying drawing of which:

Figure 1:
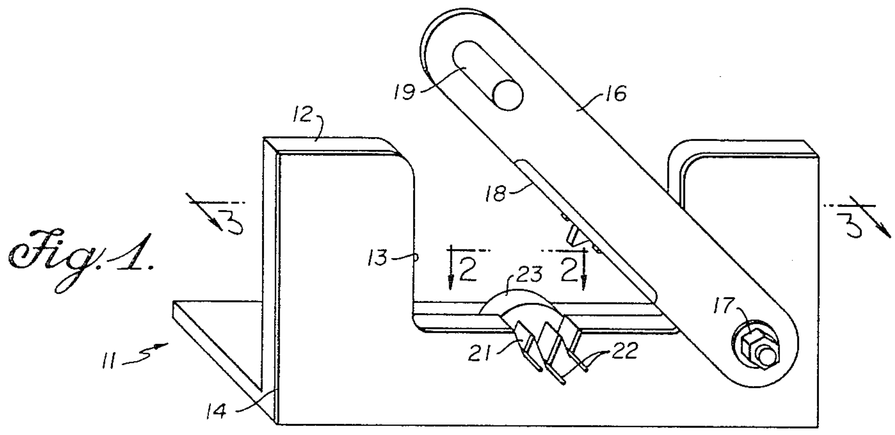
FIGURE 1 is a perspective view of the device.

Referring now to FIGURE 1 there is shown a right-angled base 11, the short vertical leg 12 of which has a U-shaped depression 13 in the upper edge thereof. The base 11 may be made of metal or any material heavy enough to provide stability. The outer face of the vertical leg 12 is fitted with a hard metal plate 14, capable of withstanding cutting action thereagainst. A cutting arm 16 is mounted toward one side of the outer face of leg 12 by means of a pivot bolt 17. Upon rotation of the arm 16, a beveled knife-edge 18 provided along one side thereof produces a cutting action with the opposing edge of the plate 14. For ease of operation a handle 19 is provided at the free end of arm 16.

Figure 2:
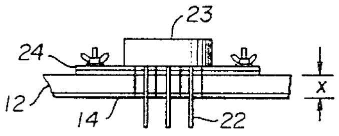
FIGURE 2 is a partial plan view taken along line 2—2 of FIGURE 1.

A series of V-shaped grooves 21 are cut into the upper edge of the laminar vertical leg 12 and plate 14. The grooves 21 are arranged to accommodate the terminal leads 22 extending from the body of a semiconductor element 23 placed against the inner side of leg 12. In the present embodiment three such grooves 21 are shown, the troughs of which correspond to the positions of the leads on a typical transistor. As can be seen in FIGURE 2, the thickness of the leg member 12, designated by "$x$," determines the cut length of the semiconductor leads 22. The lead length can be varied by clamping shim plates 24 behind the leg 12 to increase the separation of the semiconductor element 23 from the cutting arm 16.

Figure 3:
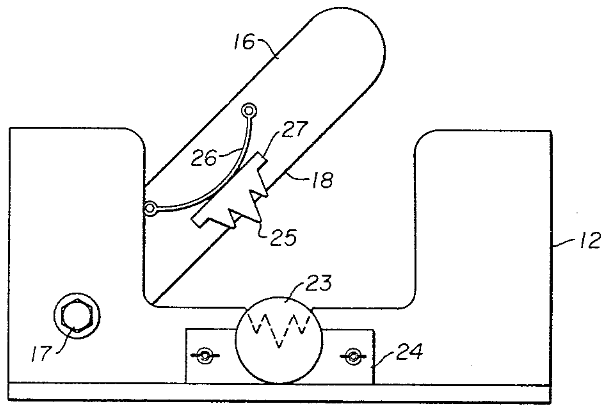
FIGURE 3 is an elevation view taken along line 3—3 of FIGURE 1.

Referring now to FIGURE 3, a leaf spring 26 is affixed to the reverse side of cutting arm 16. A clamping block 27 is attached to the downward arch of leaf spring 26 with a saw-toothed edge of the block extending slightly beyond the knife-edge 18 of the arm 16. The sawtooth edge of block 27 is patterned to exactly fit the V-shaped grooves 21 of the vertical base leg 12 and to mesh therewith upon the downward travel of the arm 16. The points 28 of the sawtooth or block 27 are slightly squared off, however, to accommodate the leads 22 in the bottom of grooves 21. By virtue of its leading position on arm 16, the downward travel firmly clamps the block 27 against the terminal leads 22 in grooves 21 prior to the arrival of the knife-edge 18 thereat, whereupon the further travel of the arm 16 is allowed by leaf spring 26 and the knife-edge 18 cuts through the lead 22 material. The leaf spring 26 also serves as a stop to the upward stroke of the cutting arm 16 by its abutment against vertical leg member 12.

Considering the operation of the device as normally used in the fabrication of circuits having large numbers of such semiconductor elements, the necessary lead 22 length for coupling to the particular chassis or circuit panel is determined and the equivalent separation thickness of vertical leg 12 built up by the shim plates 24. The elements may thereupon be cut all at once, or as needed. In either case, the operation is quick and convenient. Little attention or manipulation is required on the part of the operator as the elements are easily positioned and essentially self-aligning in the grooves 21. All the leads 22 of the element 23 are cut in one stroke, uniformly and accurately, and without the potential damage arising from the use of conventional lead-cutting shears.

While the invention has been described with reference to a single embodiment and for a particular arrangement of terminal lead wires, it will be apparent to those skilled in the art that numerous variations and modifications are possible, and it is not intended to limit the invention except as defined by the following claims.

What is claimed is:

1. A cutting tool for trimming the leads of a semiconductor circuit element without damage to the barrier junction thereof, comprising a first cutting member having a grooved rest therein for the placement of said leads transverse to the cutting edge thereof, and a second opposing cutting member having a toothed clamp attached thereto to seat against said grooved rest during the cutting motion of said first and second cutting members.

2. A cutting tool as described in claim 1 wherein said first cutting member is a stationary platform and said second cutting member is a pivoted cutting arm acting thereagainst.

3. In a cutting device for particular use on the terminal lead wires of a semiconductor circuit element or the like, the combination comprising, a platform having a raised vertical member along one side thereof with transverse grooves provided in the upper edge thereof to accommodate the multiple lead wires of said semiconductor element as placed against the inner side of said member, a cutting arm pivoted at one end to the outer side of said vertical member with a knife-edge thereof travelable against the upper edge of said member, and a spring-mounted clamp on said cutting arm and projecting slightly downward from the knife-edge thereof to seat in said grooves on the downward stroke of said cutting arm prior to contact of said knife-edge with said lead wires.

4. A cutting device as described in claim 3 wherein said grooves are V-shaped and positioned to accommodate the multiple leads of said semiconductor in separate ones thereof, and said clamp has a series of saw-teeth shaped to conform to said grooves and having the points thereof slightly squared-off.

5. A cutting device as described in claim 3 wherein the thickness of said vertical member may be varied to the desired cut length of said leads.

References Cited

UNITED STATES PATENTS

| | | | |
|---|---|---|---|
| 2,690,574 | 10/1954 | Clark | 83—375 X |
| 3,232,158 | 2/1966 | Breeding | 83—465 |
| 3,307,442 | 3/1967 | Imhoff | 83—925 |

WILLIAM S. LAWSON, *Primary Examiner.*